United States Patent
Simin et al.

(10) Patent No.: US 9,190,510 B2
(45) Date of Patent: Nov. 17, 2015

(54) SEMICONDUCTOR DEVICE WITH BREAKDOWN PREVENTING LAYER

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 94 days.

(21) Appl. No.: 14/040,900

(22) Filed: Sep. 30, 2013

(65) Prior Publication Data

US 2014/0091373 A1    Apr. 3, 2014

Related U.S. Application Data

(60) Provisional application No. 61/707,990, filed on Sep. 30, 2012.

(51) Int. Cl.

| | |
|---|---|
| *H01L 29/66* | (2006.01) |
| *H01L 29/78* | (2006.01) |
| *G06F 17/50* | (2006.01) |
| *H01L 29/778* | (2006.01) |
| *H01L 29/872* | (2006.01) |
| *H01L 29/40* | (2006.01) |
| *H01L 29/20* | (2006.01) |

(52) U.S. Cl.
CPC ............ *H01L 29/78* (2013.01); *G06F 17/5068* (2013.01); *H01L 29/404* (2013.01); *H01L 29/7786* (2013.01); *H01L 29/872* (2013.01); *H01L 29/2003* (2013.01); *H01L 29/402* (2013.01)

(58) Field of Classification Search
CPC .................................................. H01L 29/42364
USPC .................................................. 438/140, 454
See application file for complete search history.

(56) References Cited

U.S. PATENT DOCUMENTS

| | | | |
|---|---|---|---|
| 5,563,080 A | 10/1996 | Ahn | |
| 5,744,841 A | 4/1998 | Gilbert et al. | |
| 6,110,804 A * | 8/2000 | Parthasarathy et al. | 438/454 |
| 8,080,848 B2 * | 12/2011 | Darwish et al. | 257/343 |
| 2001/0048122 A1 | 12/2001 | Tada et al. | |
| 2005/0127373 A1 | 6/2005 | Yokota et al. | |
| 2006/0255377 A1 | 11/2006 | Tu et al. | |
| 2012/0205667 A1 | 8/2012 | Simin et al. | |

(Continued)

OTHER PUBLICATIONS

Saito et al., Theoretical limit estimation of lateral wide band-gap semiconductor power-switching device, Solid-State Electronics, 2004, pp. 1555-1562, Elsevier.

(Continued)

*Primary Examiner* — Chandra Chaudhari
(74) *Attorney, Agent, or Firm* — LaBatt, LLC

(57) ABSTRACT

A semiconductor device with a breakdown preventing layer is provided. The breakdown preventing layer can be located in a high-voltage surface region of the device. The breakdown preventing layer can include an insulating film with conducting elements embedded therein. The conducting elements can be arranged along a lateral length of the insulating film. The conducting elements can be configured to split a high electric field spike otherwise present in the high-voltage surface region during operation of the device into multiple much smaller spikes.

20 Claims, 7 Drawing Sheets

(56) References Cited

U.S. PATENT DOCUMENTS

2013/0056753 A1     3/2013    Simin et al.
2013/0127521 A1     5/2013    Simin et al.

OTHER PUBLICATIONS

Feiler et al., Multistep Field Plates for High-Voltage Planar p-n Junctions, IEEE Transactions on Electron Devices, Jun. 1992, pp. 1514-1520, vol. 39 No. 6, IEEE.

Karmalkar et al., Enhancement of Breakdown Voltage in AlGaN/GaN High Electron Mobility Transistors Using a Field Plate, IEEE Transactions on Electron Devices, Aug. 2001, pp. 1515-1521, vol. 48 No. 8., IEEE.

Choi, International Search Report for PCT/US2013/062540, Jan. 16, 2014, 13 pages.

Karmalkar, S.; Shur, M.S.; Simin, G.; Khan, M.A., Field-plate engineering for HFETs, IEEE Trans. on Electron Devices, V. 52, pp. 2534-2540 (2005).

* cited by examiner

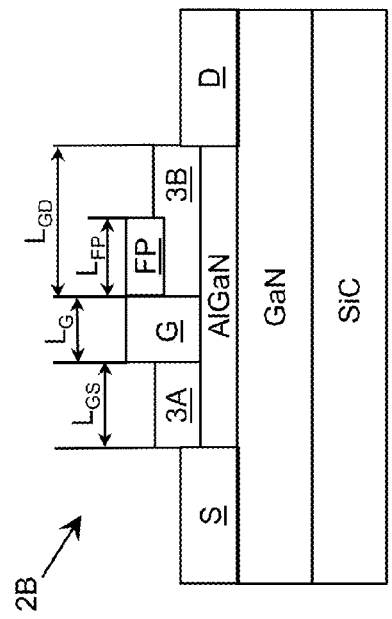
FIG. 1A *Prior Art*
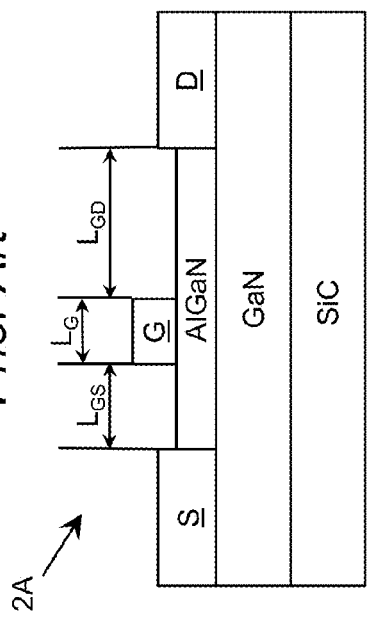
FIG. 1B *Prior Art*
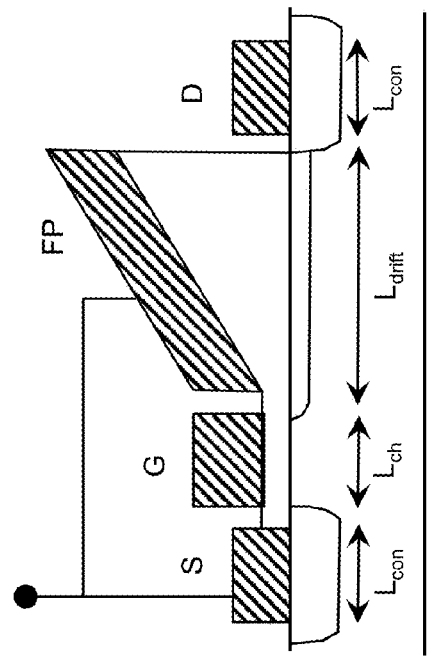
FIG. 1C *Prior Art*
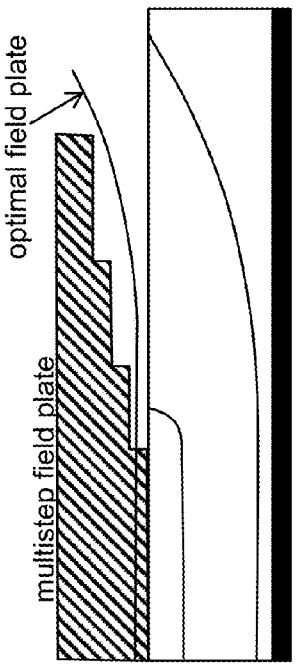
FIG. 1D *Prior Art*

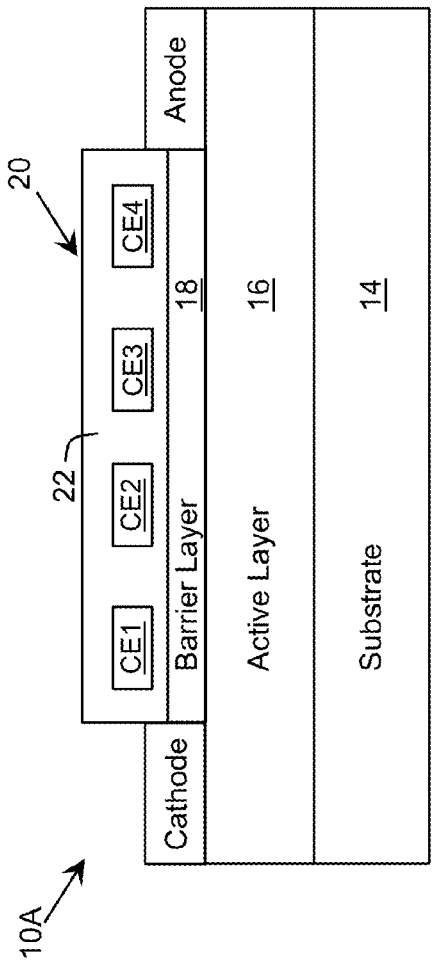
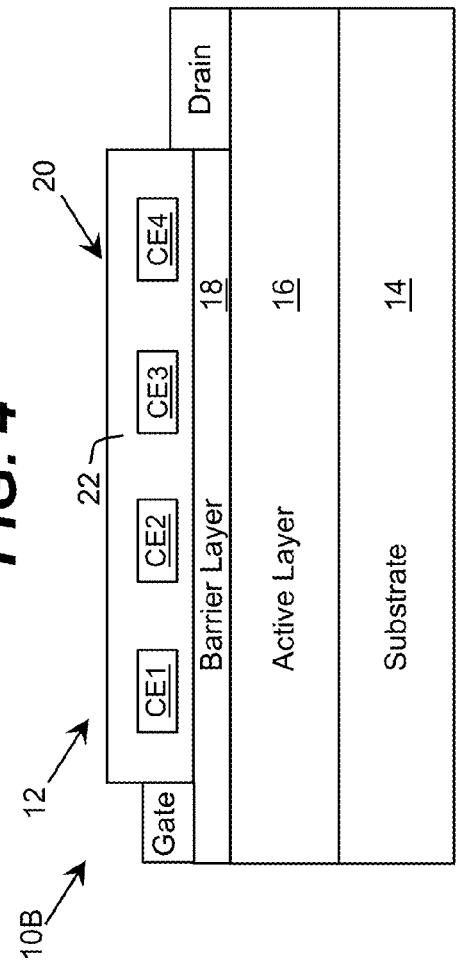

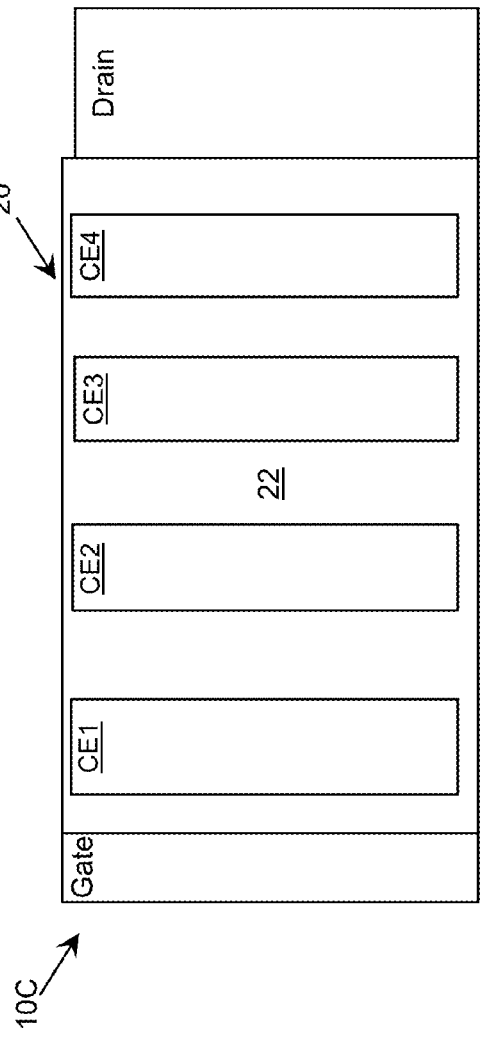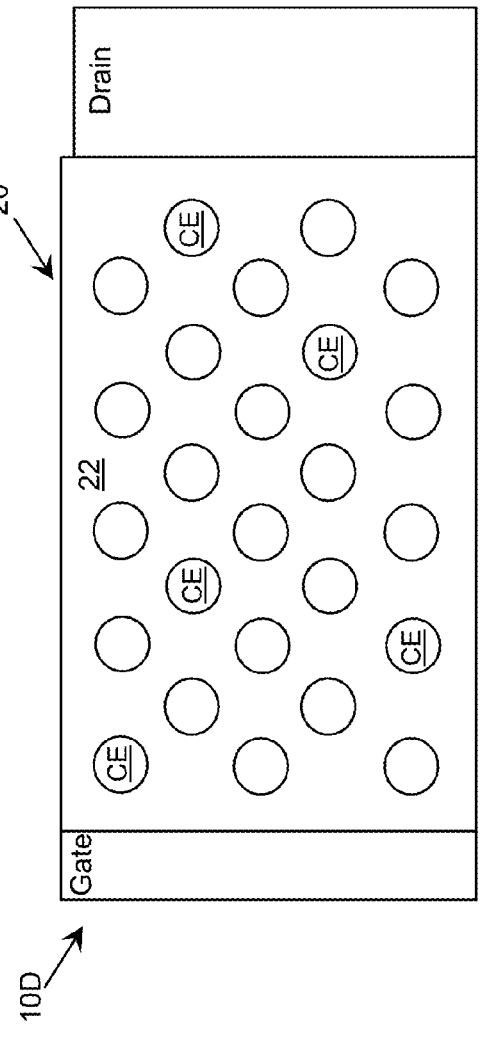

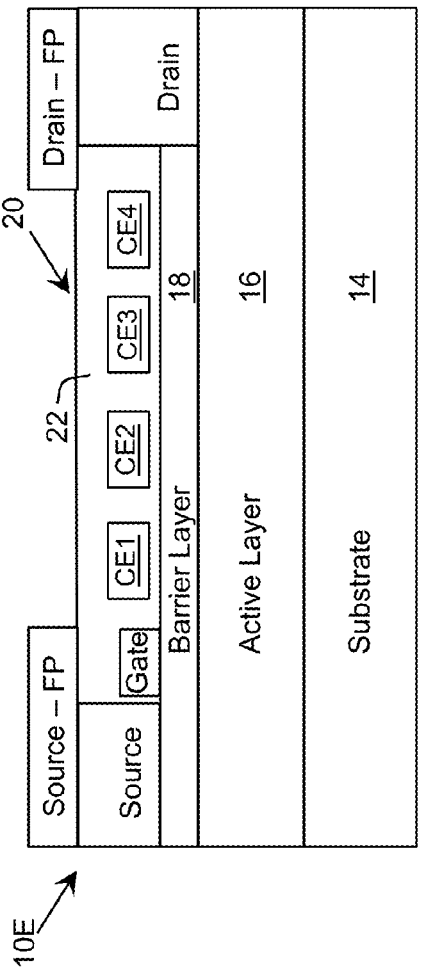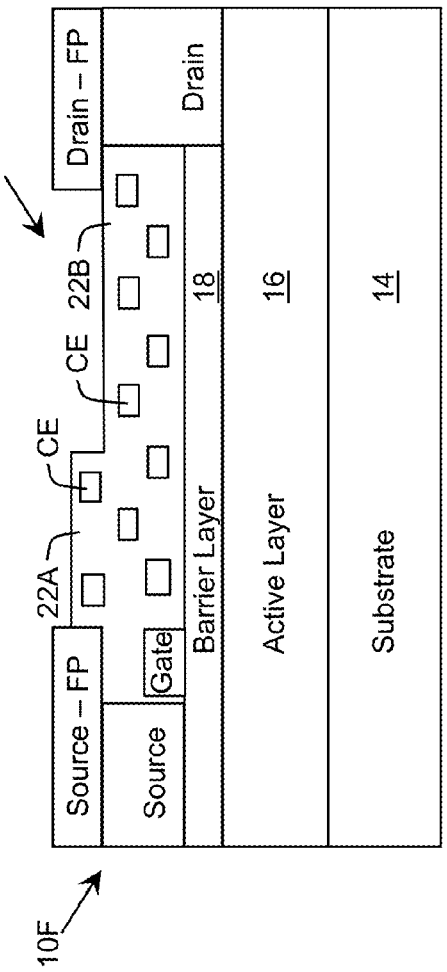

SEMICONDUCTOR DEVICE WITH BREAKDOWN PREVENTING LAYER

REFERENCE TO RELATED APPLICATIONS

The current application claims the benefit of U.S. Provisional Application No. 61/707,990, titled "Semiconductor Device with Breakdown Preventing Crystal," which was filed on 30 Sep. 2012, and which is hereby incorporated by reference.

TECHNICAL FIELD

The disclosure relates generally to semiconductor device design, and more particularly, to a solution for increasing an operating voltage and/or a maximum power of a semiconductor device.

BACKGROUND ART

In power semiconductor devices, achieving the highest breakdown voltage simultaneously with minimal on-resistance is one of the most important performance characteristics. Lateral geometry devices, such as field-effect transistors (FETs), including metal oxide semiconductor FETs (MOSFETs), metal semiconductor FETs (MESFETs), high electron mobility transistors (HEMTs), etc., have a channel aligned along the semiconductor surface, and which is often located close to the semiconductor surface. If the space-charge (depletion) region occupies only a portion of the gate-drain spacing, the electric field in that spacing is strongly non-uniform and can result in premature breakdown, which limits the device performance. Due to a high carrier concentration in the channel and the close vicinity of the channel to the semiconductor surface, efficient control over the space charge distribution in the gate-drain spacing is extremely challenging.

FIG. 1A shows a conventional heterostructure FET (HFET) 2A according to the prior art, and FIG. 2 shows an illustrative electric field distribution chart according to the prior art. As illustrated in FIG. 2, the electric field profile in the gate-drain spacing having a distance, LGD, shown in FIG. 1A exhibits a strong peak near the gate edge when the HFET 2A is operated as a switch (without a field plate). The peak width is defined by the carrier concentration in the channel. To this extent, a breakdown voltage for the HFET 2A does not increase when the gate-drain spacing distance LGD is increased.

One approach to lower the peak electric field near the gate edge is the use of one or more field-modulating plates (FPs), which can be connected to either the gate, source, or drain electrode. FIG. 1B shows a conventional heterostructure FET (HFET) 2B including a field plate FP according to the prior art. A multistep field plate structure is shown in FIG. 1C, and a gradual field plate structure is shown in FIG. 1D. As illustrated in FIG. 2, the field plate structure decreases the peak field near the gate electrode edge by splitting it into two peaks, thereby increasing the breakdown voltage for the device. However, even the multiple field plate structures, which split the electric field into even more peaks, cannot achieve a uniform electric field in the device channel.

Additionally, optimal configuration of multiple field plates is difficult to achieve. For example, the optimal configuration requires precisely controlled field plate length and dielectric thickness variation along the channel. In addition, prior art field plates have either source or gate potential applied to them, and therefore significant voltage exists between the field plate and the drain electrode. As a result, a device including field plate(s) can suffer from premature breakdown between the field plate(s) and the drain electrode. Furthermore, the field plate(s) increases the inter-electrode and electrode-semiconductor capacitances and therefore decreases the device maximum operating frequency.

As a result of the above limitations, current high-voltage FET switches (i) do not achieve the breakdown voltages predicted by fundamental material properties and (ii) exhibit breakdown voltage—gate-drain spacing dependence saturating at high voltages, typically four hundred volts and above, which imposes serious limitations on device design for kilovolt switching applications.

SUMMARY OF THE INVENTION

Aspects of the invention provide a semiconductor device with a breakdown preventing layer. The breakdown preventing layer can be located in a high-voltage surface region of the device. The breakdown preventing layer can include an insulating film with conducting elements embedded therein. The conducting elements can be arranged along a lateral length of the insulating film. The conducting elements can be configured to split a high electric field spike otherwise present in the high-voltage surface region during operation of the device into multiple much smaller spikes.

A first aspect of the invention provides a lateral semiconductor device comprising: a device channel; a first contact on a first end of the device channel; a second contact on a second end of the device channel, wherein the second end is opposite the first end, and wherein the first and second contacts are located on a first side of the device channel; and a breakdown preventing layer located on the first side of the device channel in at least a portion of a spacing between the first contact and the second contact, wherein the breakdown preventing layer comprises: an insulating film; and a plurality of conducting elements embedded in the insulating film, wherein the plurality of conducting elements are arranged along a lateral length of the insulating film.

A second aspect of the invention provides a field effect transistor comprising: a device channel; a source contact on a first end of the device channel; a drain contact on a second end of the device channel, wherein the second end is opposite the first end, and wherein the source and drain contacts are located on a first side of the device channel; a gate located on the first side of the device channel between the source contact and the drain contact; and a breakdown preventing layer located on the first side of the device channel in at least a portion of at least one of: a spacing between the source contact and the gate or a spacing between the drain contact and the gate, wherein the breakdown preventing layer comprises: an insulating film; and a plurality of conducting elements embedded in the insulating film, wherein the plurality of conducting elements are arranged along a lateral length of the insulating film.

A third aspect of the invention provides a method comprising: creating a design for a lateral semiconductor device, wherein the design for the lateral semiconductor device defines a device including: a device channel; a first contact on a first end of the device channel; a second contact on a second end of the device channel, wherein the second end is opposite the first end, and wherein the first and second contacts are located on a first side of the device channel; and a breakdown preventing layer located on the first side of the device channel in at least a portion of a spacing between the first contact and the second contact, wherein the breakdown preventing layer comprises: an insulating film; and a plurality of conducting elements embedded in the insulating film, wherein the plurality of conducting elements are arranged along a lateral length of the insulating film; and fabricating the lateral semiconductor device according to the design.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A-1D show conventional field effect transistors according to the prior art.

FIG. 3 shows a schematic structure of an illustrative device, which can be operated as a diode, according to an embodiment.

FIG. 4 shows a schematic structure of a gate-drain region of an illustrative device, which can be operated as a field-effect transistor, according to an embodiment.

FIG. 5 shows a schematic top view of a gate-drain region of an illustrative device, which can be operated as a field-effect transistor, according to an embodiment.

FIG. 6 shows a schematic top view of a gate-drain region of another illustrative device, which can be operated as a field-effect transistor, according to an embodiment.

FIG. 7 shows a schematic structure of an illustrative device, which can be operated as a field-effect transistor, according to an embodiment.

FIG. 8 shows a schematic structure of an illustrative device, which can be operated as a field-effect transistor, according to another embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2:
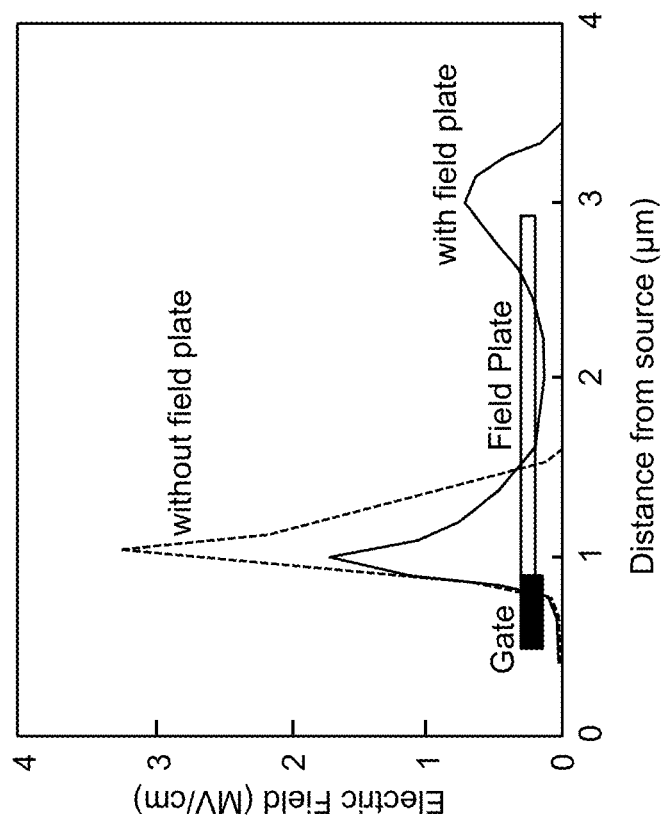
FIG. 2 shows an illustrative electric field distribution chart according to the prior art.

As indicated above, aspects of the invention provide a semiconductor device with a breakdown preventing layer. The breakdown preventing layer can be located in a high-voltage surface region of the device. The breakdown preventing layer can include an insulating film with conducting elements embedded therein. The conducting elements can be arranged along a lateral length of the insulating film. The conducting elements can be configured to split a high electric field spike otherwise present in the high-voltage surface region during operation of the device into multiple much smaller spikes. In this manner, an overall electric field present in the high-voltage surface region can be made more uniform, thereby reducing occurrences of premature breakdown, increasing an operating voltage of the device, increasing a maximum power of the device, and/or the like. As used herein, unless otherwise noted, the term "set" means one or more (i.e., at least one) and the phrase "any solution" means any now known or later developed solution.

Turning to the drawings, FIG. 3 shows a schematic structure of an illustrative device 10A, which can be operated as a (planar) diode, according to an embodiment, and FIG. 4 shows a schematic structure of a gate-drain region 12 of an illustrative device 10B, which can be operated as a field-effect transistor, according to an embodiment. Each device 10A, 10B is shown including a substrate 14, an active layer 16, and a barrier layer 18. A channel is formed at a junction of the active layer 16 and the barrier layer 18. In an embodiment, the substrate 14 is formed of silicon carbide (SiC), the active layer 16 is formed of gallium nitride (GaN), and the barrier layer 18 is formed of aluminum gallium nitride (AlGaN). The device 10A is shown including an anode and a cathode, and the device 10B is shown including a gate and a drain. Each of the anode, cathode, gate, and drain are located on a first side of the channel (e.g., above the active layer 16), can be formed of metal, and can form any type of interface to the channel (e.g., Schottky, junction, heterojunction, metal insulator semiconductor, and/or the like).

However, it is understood that this is only illustrative of various possible devices. To this extent, a semiconductor described herein can be formed of any type of semiconductor material. Illustrative semiconductor materials include: silicon (Si), silicon carbide (SiC), germanium (Ge), zinc oxide (ZnO), various types of group III-V or II-VI compound materials, and/or the like. Additionally, a device described herein can be fabricated on a substrate 14 formed of any of various types of compound semiconductor or dielectric materials, including for example: sapphire; diamond; mica; ceramic; Ge; various types of group III nitride substrates including GaN, AlN, BN, AlGaN, AlGaInN, GaBN, AlBN, AlInBN, AlGaBN, and/or the like; $LiGaO_2$; $LiNbO_2$; ZnO; Si; SiC; GaAs; and/or the like. Furthermore, the substrate 14 can comprise a conducting and/or semiconducting substrate.

Similarly, layers 16, 18 can be formed of any combination of various types of group III-V or II-VI compound materials. Illustrative group III-V materials include group III nitride materials, which include one or more group III elements (e.g., boron (B), aluminum (Al), gallium (Ga), and indium (In)) and nitrogen (N), such that $B_W Al_X Ga_Y In_Z N$, where $0 \le W, X, Y, Z \le 1$, and $W+X+Y+Z=1$. Illustrative group III nitride materials include AlN, GaN, InN, BN, AlGaN, AlInN, AlBN, GaBN, InGaN, AlGaBN, AlGaInN, AlInBN, and AlGaInBN with any molar fraction of group III elements. Additional illustrative group III-V materials include GaAs, GaAlAs, InGaAs, indium phosphorus (InP), and/or the like.

While not shown for clarity, it is understood that a device 10A, 10B can include various additional contacts (e.g., a source contact for the device 10B) and/or layers (e.g., an initiation layer and/or a buffer layer located between the substrate 14 and the active layer 16). Additionally, one or more of the layers in a heterostructure described herein can include one or more attributes to alleviate strain. For example, a layer can be formed of a superlattice structure. Regardless, each device 10A, 10B, and components thereof, can be manufactured and fabricated using any solution.

Additionally, each device 10A, 10B is shown including a breakdown preventing layer 20. The breakdown preventing layer 20 can be located in a high-voltage surface region of the corresponding device 10A, 10B. In the device 10A, the breakdown preventing layer 20 covers an entirety of the space between the anode and the cathode. In the device 10B, the breakdown preventing layer 20 covers an entirety of the space between the gate and the drain. While not shown, it is understood that a breakdown preventing layer can be located in the space between the gate and a source of a field-effect transistor. While each breakdown preventing layer 20 is shown extending across the entire high-voltage surface region between the corresponding contacts, it is understood that a device can include a breakdown preventing layer located in only a portion of the region. In this case, the breakdown preventing layer may contact only one of the contact or may not contact either of the contacts.

In an embodiment, the breakdown preventing layer 20 comprises a plurality of conducting elements CE1-CE4 embedded (e.g., enclosed) in an insulating film 22. It is understood that while each device 10A, 10B is shown including four conducting elements CE1-CE4, a device can include any number of one or more conducting elements CE1-CE4 embedded in the insulating film 22. When multiple conducting elements CE1-CE4 are included, the conducting elements CE1-CE4 can be spaced uniformly or non-uniformly across a lateral length of the breakdown preventing layer 20 (e.g., within the high-voltage surface region). Regardless, each conducting element CE1-CE4 can be fabricated using any solution and can be formed of any type of conducting/highly-conducting material, such as a metal, a semiconductor, an amorphous solid, a polycrystalline material, and/or the like.

The insulating film 22 can be formed of any type of insulating material. In an embodiment, the insulating film 22 is formed of a layer of a dielectric material, such as silicon dioxide ($SiO_2$), silicon nitride ($Si_3N_4$), hafnium oxide ($HfO_2$), aluminum oxide ($Al_2O_3$), and/or the like. In another embodiment, the insulating film 22 is formed of a layer of a low conducting material, which can help discharge a charge associated with the surface or bulk of the device 10A, 10B and thus reduce/eliminate unwanted dispersion and/or lag in the device 10A, 10B transient and/or high-frequency characteristics. The low conducting material can have a surface resistance that is significantly higher than that of metal electrodes, but is also much lower than that of a dielectric material. For example, the low conducting material can have a sheet resistance between approximately $10^3$ Ohm per square and approximately $10^7$ Ohm per square. Similarly, the low conducting material can have a surface conductivity that is significantly lower than that of metal electrodes, but is also much higher than that of a dielectric material. As a result, the associated characteristic charging-recharging time of the insulating film 22 is much higher than that of metal electrodes and the conducting elements CE1-CE4 embedded therein. Illustrative low conducting materials include, for example: InGaN; a semiconductor; a low conducting dielectric single crystal; a textured, poly-crystalline or amorphous material; a semimetal material; oxides of nickel and other metals, and/or the like.

The conducting elements CE1-CE4 can have any shape and/or location pattern within the corresponding insulating film 22. For example, FIG. 5 shows a schematic top view of a gate-drain region of an illustrative device 100, which can be operated as a field-effect transistor, according to an embodiment. In this case, each conducting element CE1-CE4 comprises an elongate rectangular (e.g., stripe) shape, which extends along substantially all of a lateral width of the insulating film 22 and has the shorter side aligned with the direction of the surface lateral electrical field lines present during operation of the device 10C. Alternatively, FIG. 6 shows a schematic top view of a gate-drain region of another illustrative device 10D, which can be operated as a field-effect transistor, according to an embodiment. In this case, each conducting element CE comprises an isolated element illustrated as having a spherical shape (e.g., dot). To this extent, each conducting element CE only occupies a relatively small portion of the lateral length and lateral width of the insulating film 22. While the conducting elements CE are shown having spherical shapes, a conducting element CE can have any shape. As illustrated, the conducting elements CE can be periodically located, such as along a hexagonal lattice, in various rows/columns, and/or the like, within the insulating film 22. However, it is understood that this is only illustrative, and the conducting elements CE can be located aperiodically.

Embodiments can provide a device with one or more additional design features to further improve the performance of the device. For example, FIG. 7 shows a schematic structure of an illustrative device 10E, which can be operated as a field-effect transistor, according to an embodiment. In this case, the device 10E is shown including both a drain field plate (Drain—FP) connected to the drain and a source field plate (Source—FP) connected to the source. Each field plate is located on a portion of the insulating film 22. Furthermore, the insulating film 22 is shown extending over the gate and within the gate-source region of the device 10E, thereby covering an entire surface of the device active region. It is understood that while the conducting elements CE1-CE4 are shown only in the gate-drain region of the device 10E, one or more conducting elements can be located within the gate-source region. Alternatively, the conducting elements CE1-CE4 can be located only in the gate-source region. Additionally, it is understood that while the source and the drain are each shown including single field plate, embodiments can include a source and a drain including any number of zero or more field plates (e.g., only a source field plate, only a drain field plate, multiple field plates for the source and/or drain, etc.). Additional design features, which can be included in embodiments include: a multiple gate configuration; a bottom electrode located below the substrate 14; a gate dielectric layer; a heat sink element; and/or the like. Furthermore, embodiments include devices having normally-on channels and devices having normally-off channels.

Additionally, it is understood that embodiments provide various configurations of the breakdown preventing layer 20. For example, FIG. 8 shows a schematic structure of an illustrative device 10F, which can be operated as a field-effect transistor, according to another embodiment. In this case, the device 10F is shown including a breakdown preventing layer 20 having a non-uniform thickness, which can be configured to further improve a uniformity of the electric field in the high-voltage surface region of the device. In an embodiment, the thickness can be increased in a sub-region of the high-voltage surface region of the device 10F having relatively higher electric field than other sub-region(s) of the high-voltage surface region of the device 10F. For example, the device 10F is shown including a first region 22A of insulating film located near the gate, which has a larger thickness than a second region 22B of the insulating film located near the drain. However, it is understood that this is only illustrative of varying thicknesses that can be implemented on various types of devices (e.g., on a diode, on a device with no field plates, and/or the like).

Additionally, the breakdown preventing layer 20 is shown including a plurality of conducting elements CE arranged in both lateral and vertical directions with respect to a surface of the device 10F between the device electrodes (e.g., the gate and the drain). The arrangement can be aperiodic or periodic (e.g., on a lattice), and can enable an increased density of conducting elements CE as compared to an embodiment in which all of the conducting elements CE are on a single vertical plane. The increased density can further reduce a total length of the regions under the conducting elements CE where the electric field is close to zero, thereby reducing an average electric field present in the high-voltage surface region of the device.

Figure 9:
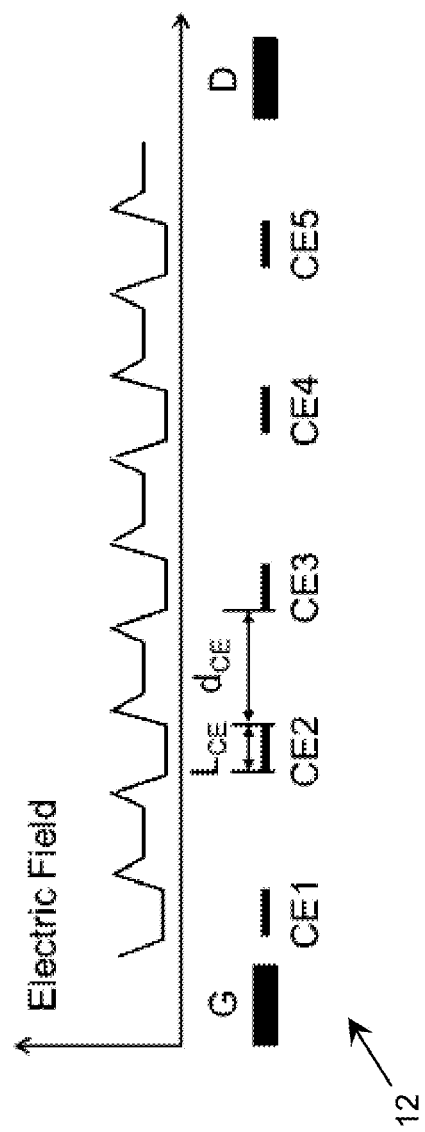
FIG. 9 shows an illustrative electric field distribution in a gate-drain region of a field-effect transistor according to an embodiment.

When implemented in a circuit, the conducting elements described herein can have a floating potential. The presence of the conducting elements embedded in an insulating layer as described herein can significantly reduce a peak electric field in a high-voltage region of a lateral device of any type (e.g., diode, field-effect transistor, and/or the like) during operation of the device within the circuit. FIG. 9 shows an illustrative electric field distribution in a gate-drain region 12 of a field-effect transistor according to an embodiment. In this case, the gate-drain region 12 includes five conducting elements CE1-CE5, which are embedded in an insulating layer (not shown) between the gate and the drain of the corresponding device. As illustrated, an electric field under each of the conducting elements CE1-CE5 is very low, e.g., two to three times lower than the peak field at the conducting element edge. Additionally, each conducting element CE1-CE5 generates two electric field spikes (fringing fields) at its edges.

A breakdown preventing layer described herein is electrostatically coupled to the channel of the device. During operation of the device, the breakdown preventing layer induces a lateral electric field in the channel and at a surface of the device to be close to that in the breakdown preventing layer. As the electric field within each highly conducting element is very low, the electric field in the breakdown preventing layer is comprised mainly of the fringing electric fields at the edges of each of the conducting elements CE1-CE5, as shown in FIG. 9, and a gradually increasing electric field in the spacing between the conducting elements CE1-CE5. In an embodiment, the spacing between the conducting elements CE1-CE5 is selected so that the electric field in the spacing between the conducting elements CE1-CE5 remains quasi-uniform. The breakdown preventing layer splits high electric field spikes at the gate/drain edges (e.g., as shown in FIG. 2) into a large number of much smaller spikes with nearly uniform electric fields in between (e.g., as shown in FIG. 9). As a result, an overall electric field is more uniform than that of the prior art devices. The more uniform electric field can reduce instances of premature breakdown of the device. Furthermore, the conducting elements CE1-CE5 in the breakdown preventing layer can provide surface compensating charges, and therefore reduce device dependence on the surface conditions.

In an embodiment, a minimal lateral spacing between conducting elements in a breakdown preventing layer is defined by a characteristic size of the lateral edge field spike. The characteristic size of the edge field spike can be obtained by solving the electrostatic field distribution for the particular device. For a typical AlGaN/GaN heterostructure with a barrier layer 18 (FIG. 3) having a thickness of approximately twenty nanometers, an estimate of the lateral electric field spread around the edge, $\Delta E_{FR}$, is approximately 0.3 μm. Assuming a conducting element spacing, $d_{CE}$, being close to the fringing field spread ($d_{CE} \approx \Delta E_{FR}$), a maximum electric field in the high-field region (e.g., the gate-to-drain spacing 12) can be calculated as:

$$E_M = \frac{2V}{Nd_{CE}} \quad (1)$$

where V is the voltage across the high-field region (e.g., gate-drain voltage, reverse voltage across a diode, and/or the like), and N is the number of conducting elements in the high-field region. For a value of N=1, equation (1) provides an approximate expression for the peak electric field in a device including an optimally configured field plate. As illustrated, in a device with a high number of conducting elements as described herein, the peak electric field is significantly reduced from that present for a device including the optimally configured field plate. For example, for N=5, the peak electric field is five times lower than that of a device with an optimally configured field plate.

A separation between the conducting elements and the device surface channel can be defined by a vertical fringing field spread, $\Delta E_{FRV}$, which can be estimated using any solution. In an embodiment, the conducting element-surface distance, $d_V$, can be approximately equal to the vertical fringing field spread, e.g., $d_V \approx \Delta E_{FRV}$. For a typical AlGaN/GaN heterostructure, $d_V \approx \Delta E_{FRV} \approx 0.2$ to 0.7 μm. Correspondingly, a thickness of the insulating film in which the conducting elements are embedded, $d_{BPC}$, can be approximately two to four times the conducting element-surface distance, e.g., $d_{BPC} \geq (2-4) \times d_V$. In an embodiment, a vertical spacing between conducting elements arranged vertically (e.g., as shown in FIG. 8) does not exceed $d_V$. A minimal vertical spacing is limited by the technology used. For example, the vertical spacing can be selected to avoid short circuits between the elements, and typically should not be less than a few nanometers.

In an embodiment, a length of the each conducting element, $L_{CE}$, is selected to be as small as obtainable by the device fabrication process. In this case, a total length of the regions under the conducting elements with very low electric fields is reduced/minimized, which results in the average electric field being reduced/minimized. In an illustrative embodiment, the lateral length of each conducting element is less than half the distance between conducting elements. In another illustrative embodiment, the lateral length of each conducting element is an order of magnitude smaller than the lateral distance between conducting elements, e.g., $L_{CE} = (0.1-0.5) \times d_{CE}$.

As described herein, the conducting elements can be formed from metal or any other conducting material. In an embodiment, the material is selected to meet a requirement that the electric field distribution near the conducting element follows quasi-instantly a voltage change across the device. To meet this requirement, a characteristic RC constant given by a product of the lateral resistance of the conducting element and a capacitance between the conducting element and the channel is smaller (e.g., 3-10 times smaller) than a period corresponding to an operating frequency of the device.

Fabrication of a device having a schematic structure described herein can be performed using any solution. Although any number of conducting elements can be utilized, a significant peak field reduction can be achieved with three or more conducting elements. In an embodiment, the number of conducting elements located within a region is selected based on the lateral length of the corresponding region, the lateral length of each conducting element, and a target spacing between the conducting elements.

Aspects of the invention are shown and described primarily with reference to a heterostructure field-effect transistor and diode. However, it is understood that aspects of the invention can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like. Additionally, as described herein, aspects of the invention can be implemented in other types of semiconductor devices, including for example, a diode of any type (e.g., a pn-diode, a pin-diode, a heterojunction diode, a metal insulator semiconductor diode, and/or the like), a semiconductor resistor, a semiconductor sensor, a light emitting diode, a laser, an integrated element, and/or the like.

Figure 10:
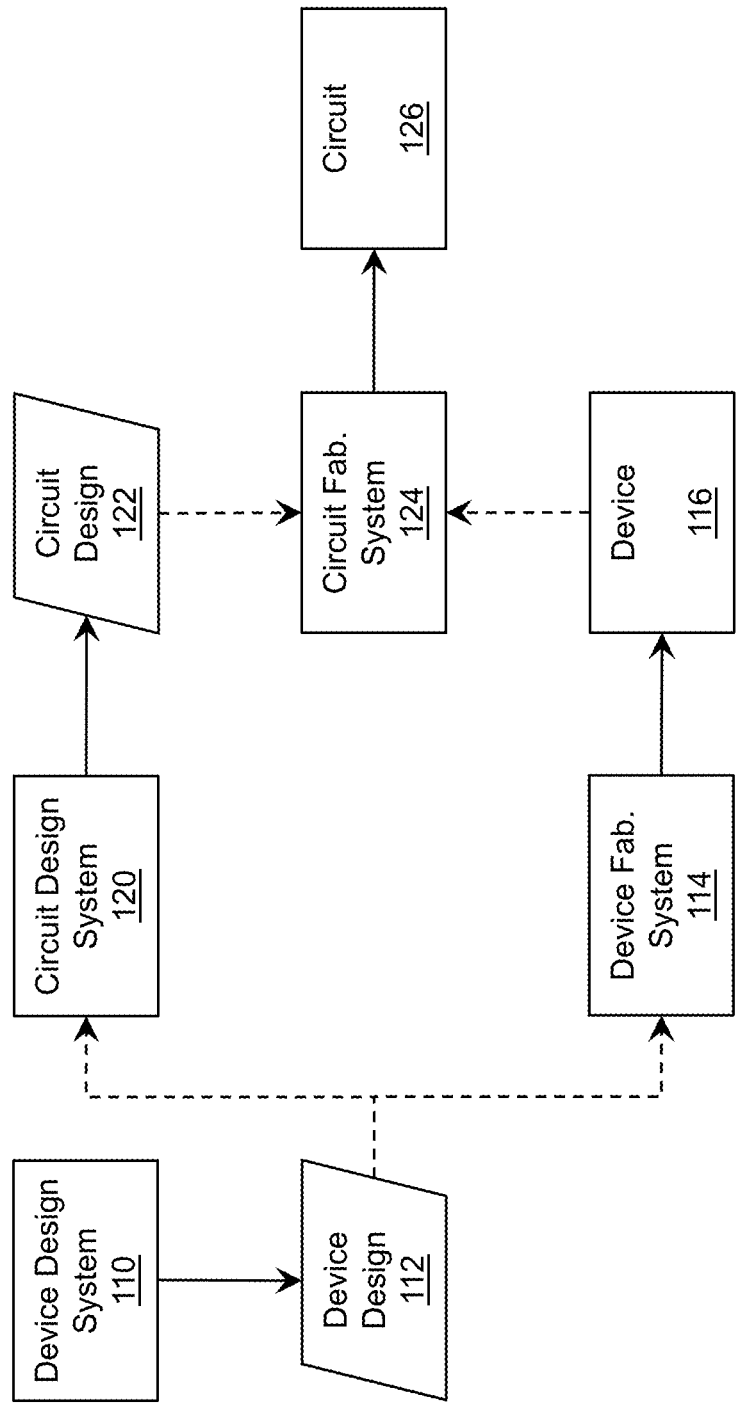
FIG. 10 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A lateral semiconductor device comprising:
   a device channel;
   a first contact on a first end of the device channel;
   a second contact on a second end of the device channel, wherein the second end is opposite the first end, and wherein the first and second contacts are located on a first side of the device channel; and
   a breakdown preventing layer located on the first side of the device channel in at least a portion of a spacing between the first contact and the second contact, wherein the breakdown preventing layer comprises:
   an insulating film; and
   a plurality of conducting elements embedded in the insulating film, wherein the plurality of conducting elements are arranged along both a lateral length and a vertical height of the insulating film.

2. The device of claim 1, wherein each of the plurality of conducting elements has a rectangular shape extending substantially all of a lateral width of the insulating film and having a shorter side aligned with a direction of surface lateral electrical field lines present during operation of the device.

3. The device of claim 1, wherein each of the plurality of conducting elements comprises an isolated element, and wherein the plurality of conducting elements are further arranged along a lateral width of the insulating film.

4. The device of claim 1, wherein a lateral spacing between two adjacent conducting elements is approximately equal to a characteristic size of a lateral edge field spike around an edge of each conducting element.

5. The device of claim 4, wherein the lateral spacing between two adjacent conducting elements is at least twice a lateral length of each of the two adjacent conducting elements.

6. A lateral semiconductor device comprising:
a device channel;
a first contact on a first end of the device channel;
a second contact on a second end of the device channel, wherein the second end is opposite the first end, and wherein the first and second contacts are located on a first side of the device channel; and
a breakdown preventing layer located on the first side of the device channel in at least a portion of a spacing between the first contact and the second contact, wherein the breakdown preventing layer comprises:
an insulating film; and
a plurality of conducting elements embedded in the insulating film, wherein the plurality of conducting elements are arranged along a lateral length of the insulating film, wherein a vertical spacing between a conducting element of the plurality of conducting elements and a device surface channel is approximately equal to a characteristic size of a vertical fringing field spread for the conducting element.

7. The device of claim 6, wherein a vertical thickness of the insulating film is at least two times the vertical spacing between the conducting element and the device surface channel.

8. The device of claim 1, wherein the insulating film has a non-uniform vertical thickness, and wherein a vertical thickness of the insulating film in a first location is greater than a vertical thickness of the insulating film in a second location having a electric field relatively lower than an electric field of the first location.

9. The device of claim 1, further comprising a gate located between the first contact and the second contact, wherein the breakdown preventing layer is located in a region between the gate and the second contact.

10. The device of claim 9, wherein the breakdown preventing layer is further located in a region between the gate and the first contact.

11. The device of claim 1, wherein at least one of the first contact or the second contact includes a field plate.

12. The device of claim 1, wherein the insulating film is formed of a layer of low conducting material, wherein the low conducting material has a sheet resistance between approximately $10^3$ Ohm per square and approximately $10^7$ Ohm per square.

13. The device of claim 1, wherein a vertical spacing between a conducting element and a device surface channel is approximately equal to a characteristic size of a vertical fringing field spread for the conducting element.

14. A field effect transistor comprising:
a device channel;
a source contact on a first end of the device channel;
a drain contact on a second end of the device channel, wherein the second end is opposite the first end, and wherein the source and drain contacts are located on a first side of the device channel;
a gate located on the first side of the device channel between the source contact and the drain contact; and
a breakdown preventing layer located on the first side of the device channel in at least a portion of at least one of: a spacing between the source contact and the gate or a spacing between the drain contact and the gate, wherein the breakdown preventing layer comprises:
an insulating film; and
a plurality of conducting elements embedded in the insulating film, wherein the plurality of conducting elements are arranged along a lateral length of the insulating film, wherein a vertical spacing between a conducting element of the plurality of conducting elements and a device surface channel is approximately equal to a characteristic size of a vertical fringing field spread for the conducting element, and wherein a vertical thickness of the insulating film is at least two times the vertical spacing between the conducting element and the device surface channel.

15. The transistor of claim 14, wherein each of the plurality of conducting elements comprises an isolated element, and wherein the plurality of conducting elements are further arranged along a lateral width of the insulating film.

16. The transistor of claim 14, wherein a lateral spacing between two adjacent conducting elements is approximately equal to a characteristic size of a lateral edge field spike around an edge of each conducting element, and wherein the lateral spacing between two adjacent conducting elements is at least twice a lateral length of each of the two adjacent conducting elements.

17. The transistor of claim 14, wherein the plurality of conducting elements are further arranged along a vertical height of the insulating film.

18. A method comprising:
creating a design for a lateral semiconductor device, wherein the design for the lateral semiconductor device defines a device including:
a device channel;
a first contact on a first end of the device channel;
a second contact on a second end of the device channel, wherein the second end is opposite the first end, and wherein the first and second contacts are located on a first side of the device channel; and
a breakdown preventing layer located on the first side of the device channel in at least a portion of a spacing between the first contact and the second contact, wherein the breakdown preventing layer comprises:
an insulating film; and
a plurality of conducting elements embedded in the insulating film, wherein the plurality of conducting elements are arranged along a lateral length of the insulating film, wherein the creating includes selecting a vertical spacing between a conducting element and a device surface channel based on a characteristic size of a vertical fringing field spread for the conducting element; and
fabricating the lateral semiconductor device according to the design.

19. The method of claim 18, wherein the creating includes arranging a lateral spacing of the plurality of conducting elements based on a characteristic size of a lateral edge field spike around an edge of each conducting element.

20. The method of claim 18, wherein the plurality of conducting elements are further arranged along a vertical height of the insulating film.

* * * * *